US009187104B2

(12) United States Patent
Fang et al.

(10) Patent No.: US 9,187,104 B2
(45) Date of Patent: Nov. 17, 2015

(54) ONLINE LEARNING USING INFORMATION FUSION FOR EQUIPMENT PREDICTIVE MAINTENANCE IN RAILWAY OPERATIONS

(71) Applicant: International Business Machines Corporation, Armonk, NY (US)

(72) Inventors: Dongping Fang, Naperville, IL (US); Arun Hampapur, Norwalk, CT (US); Qing He, East Amherst, NY (US); Hongfei Li, Briarcliff Manor, NY (US); Zhiguo Li, Yorktown Heights, NY (US); Dhaivat P. Parikh, Plano, TX (US); Buyue Qian, Sacramento, CA (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 13/873,851

(22) Filed: Apr. 30, 2013

(65) Prior Publication Data
US 2014/0200872 A1 Jul. 17, 2014

Related U.S. Application Data

(60) Provisional application No. 61/751,704, filed on Jan. 11, 2013.

(51) Int. Cl.
G06G 7/48 (2006.01)
B61K 9/08 (2006.01)
(Continued)

(52) U.S. Cl.
CPC .............. *B61K 9/08* (2013.01); *G06F 17/5009* (2013.01); *G06Q 10/06* (2013.01); *G06Q 10/0635* (2013.01)

(58) Field of Classification Search
CPC ............ B60W 50/02; B60W 50/0205; B60W 50/0225; B60W 2050/021; G06F 17/5095; G06F 17/5018; G06F 17/5009; Y02T 10/82; G05B 17/02
USPC .......................................................... 703/8
See application file for complete search history.

(56) References Cited

U.S. PATENT DOCUMENTS

| 3,381,626 | A | 5/1968 | Fagan et al. |
| 3,500,186 | A | 3/1970 | Smith et al. |

(Continued)

FOREIGN PATENT DOCUMENTS

| EP | 0982673 A2 | 3/2000 |
| WO | 2004076256 A1 | 9/2004 |

OTHER PUBLICATIONS

International Search Report and Written Opinion; International Application No. PCT/US2014/010628; International Filing date: Jan. 8, 2014; Date of Mailing: Aug. 13, 2014; 13 pages.

(Continued)

*Primary Examiner* — Saif Alhija
(74) *Attorney, Agent, or Firm* — Cantor Colburn LLP; Janice Kwon

(57) ABSTRACT

An aspect of an online learning system includes collecting data, via a computer processing device, from a plurality of data sources including multiple disparate detectors, the data including at least one of historical alarm data, failures, maintenance records, and environment observations. The data is stored in tables each corresponding to a subject of measurement. The online learning system also includes identifying common fields shared across the tables, merging at least a portion of the data across the tables having the common fields, and creating an integrated data model based on results of the merging.

7 Claims, 7 Drawing Sheets

(51) Int. Cl.
    *G06Q 10/06*    (2012.01)
    *G06F 17/50*    (2006.01)

(56)           References Cited

U.S. PATENT DOCUMENTS

| | | | |
|---|---|---|---|
| 4,173,073 | A | 11/1979 | Fukazawa et al. |
| 4,793,047 | A * | 12/1988 | Curtis et al. ............... 29/407.08 |
| 5,774,629 | A * | 6/1998 | Yamaguchi et al. ............ 706/52 |
| 5,986,547 | A | 11/1999 | Korver et al. |
| 6,324,659 | B1 | 11/2001 | Pierro |
| 7,164,975 | B2 | 1/2007 | Bidaud |
| 2002/0059075 | A1 * | 5/2002 | Schick et al. ..................... 705/1 |
| 2004/0122569 | A1 | 6/2004 | Bidaud |
| 2006/0015224 | A1 | 1/2006 | Hileary |
| 2007/0087756 | A1 | 4/2007 | Hoftberg |
| 2009/0043547 | A1 | 2/2009 | Kirby et al. |
| 2009/0063115 | A1 | 3/2009 | Lu et al. |
| 2009/0110349 | A1 | 4/2009 | Presley et al. |
| 2012/0300060 | A1 | 11/2012 | Farritor |

OTHER PUBLICATIONS

U.S. Appl. No. 13/873,829; Non-Final Office Action, Date Filed: Apr. 30, 2013; Date Mailed: Jan. 28, 2015; 15 pages.
U.S. Appl. No. 13/962,203; Non-Final Office Action; Date Filed: Aug. 8, 2013; Date Mailed: Jun. 3, 2015; 28 pages.

* cited by examiner

ONLINE LEARNING USING INFORMATION FUSION FOR EQUIPMENT PREDICTIVE MAINTENANCE IN RAILWAY OPERATIONS

CROSS-REFERENCE TO RELATED APPLICATION

This application is a nonprovisional application of U.S. patent application Ser. No. 61/751,704, filed Jan. 11, 2013, the disclosure of which is incorporated by reference herein in its entirety.

BACKGROUND

The present invention relates to data processing and, more specifically, to online learning using information fusion for equipment predictive maintenance in railway operations.

The ability to make sense of large amounts of data, or "big data" as it is often referred to, is a challenging task. With the ever-increasing numbers of available data sources and rapid, ongoing enhancements made in the computing power of data generation devices, as well as the wide variety of types of data (e.g., both structured and unstructured) that can be collected today, managing big data can require advanced techniques and technologies. Clearly, the ability to analyze and interpret these large amounts of complex and variable data has the potential to be of great value to an entity or entities responsible for or having an interest in the data. For example, in many industries that monitor the health of equipment or other assets, accurate analyses of this data can be used to predict and, thus, take measures to prevent equipment or asset failures.

SUMMARY

According to one embodiment of the present invention, a method is provided. The method includes collecting data, via a computer processing device, from a plurality of data sources including multiple disparate detectors, the data including at least one of historical alarm data, failures, maintenance records, and environmental observations. The data is stored in tables each corresponding to a subject of measurement. The method also includes identifying common fields shared across the tables, merging at least a portion of the data across the tables having the common fields, and creating an integrated data model based on results of the merging.

According to another embodiment of the present invention, a system is provided. The system includes a computer processing system communicatively coupled to data sources, and logic executable by the computer processing system. The logic is configured to implement a method. The method includes collecting data from a plurality of data sources including multiple disparate detectors, the data including at least one of historical alarm data, failures, maintenance records, and environmental observations. The data is stored in tables each corresponding to a subject of measurement. The method also includes identifying common fields shared across the tables, merging at least a portion of the data across the tables having the common fields, and creating an integrated data model based on results of the merging.

According to a further embodiment of the present invention, a computer program product is provided. The computer program product includes a storage medium embodied with machine-readable program instructions, which when executed by a computer causes the computer to implement a method. The method includes collecting data from a plurality of data sources including multiple disparate detectors, the data including at least one of historical alarm data, failures, maintenance records, and environmental observations. The data is stored in tables each corresponding to a subject of measurement. The method also includes identifying common fields shared across the tables, merging at least a portion of the data across the tables having the common fields, and creating an integrated data model based on results of the merging.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Exemplary embodiments provide predictive modeling using several analytical approaches including, e.g., correlation analysis, causal analysis, time series analysis, survival modeling, and machine learning techniques to automatically learn rules and build failure prediction models based on exploration of historical multi-detector measurements, equipment failure records, maintenance records, environmental conditions, etc. Additionally, the analytics and models can also be used for detecting root-causes of several failure modes of components, which can be proactively used by a maintenance organization to optimize trade-offs related to maintenance schedules, costs, and shop capacity.

According to an exemplary embodiment, predictive modeling for asset management (also referred to herein as "predictive modeling") is provided. The predictive modeling provides the ability to analyze and interpret large amounts of complex and variable data concerning an asset or group of assets, as well as conditions surrounding the assets. In particular, the predictive modeling provides the ability to perform large-scale, multi-detector predictive modeling and related tasks to predict when one or more of the assets might fail. Further, the predictive modeling incorporates statistical learning to predict asset failures based on large-scale, multi-dimensional sparse time series data.

Effective utilization of data provides valuable tools for operational sustainability. The predictive modeling develops the concept of composite detectors and integrates large-scale information collected from multiple detectors to predict undesired conditions of equipment and unexpected events, such as alarms that cause service interruptions.

The exemplary predictive modeling techniques described herein may be implemented for any industry that collects and processes large amounts of data from detectors in order to determine and maintain the health of one or more assets. For example, the predictive modeling processes may be implemented by the railroad industry, airline industry, or other transportation industry. The exemplary predictive modeling processes also have applications in the area of manufacturing.

Figure 1:
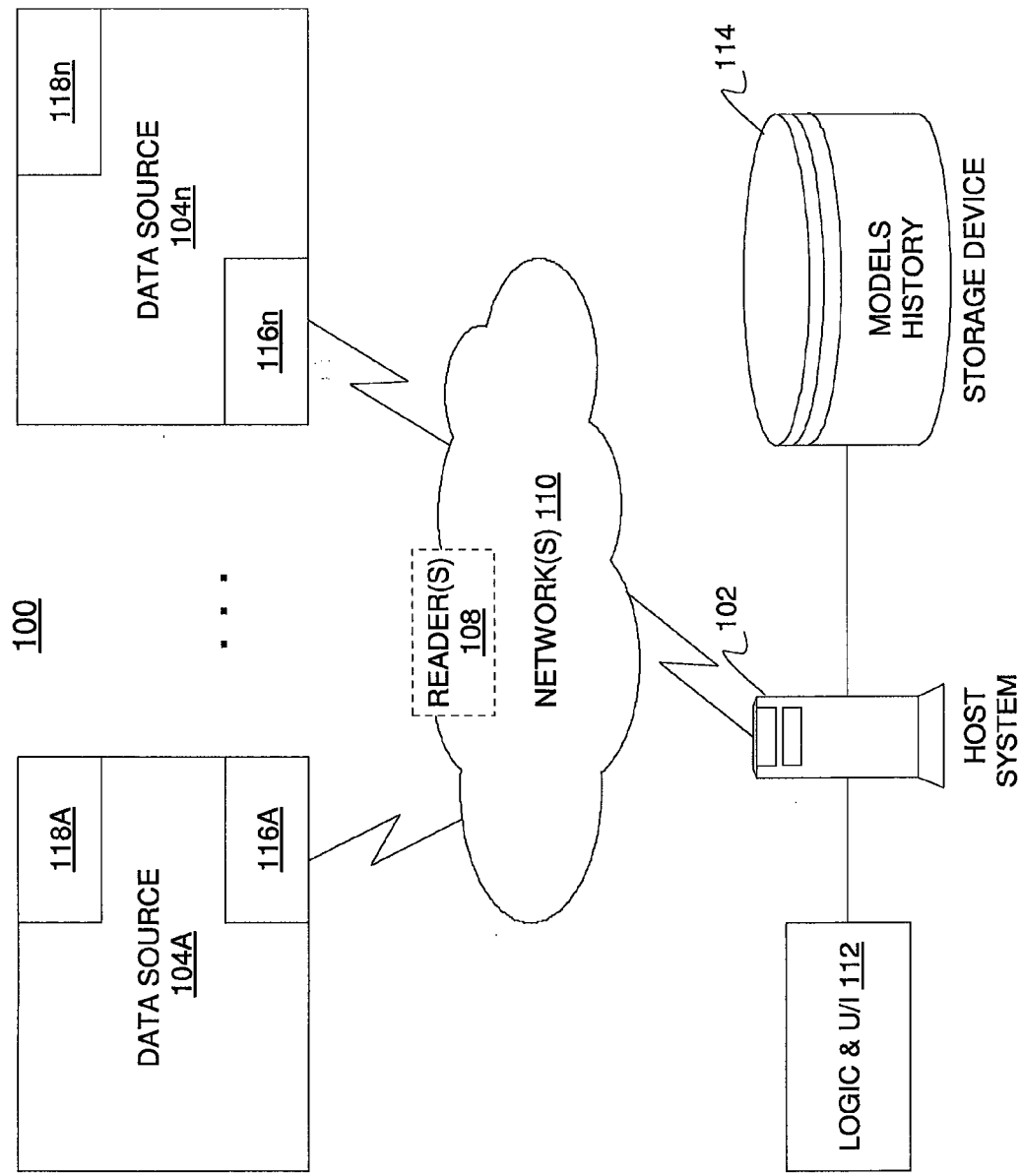
FIG. 1 depicts a block diagram of a system upon which predictive modeling for asset management may be implemented according to an embodiment of the present invention.

Turning now to FIG. 1, a system 100 upon which the predictive modeling processes may be implemented will now be described in an exemplary embodiment. The system 100 of FIG. 1 includes a host system 102 in communication with data sources 104A-104n (referred to collectively as data sources 104) over one or more networks 110.

The host system 102 may be implemented as a high-speed computer processing device (e.g., a mainframe computer) that is capable of handling a large volume of data received from the data sources 104. The host system 102 may be implemented by any entity that collects and processes a large amount of data from a multitude of data sources 104 to manage, or may be offered as a service to such entity by, e.g., an application service provider (ASP).

The data sources 104 may include devices configured to capture raw data from aspects of the asset, as well as any conditions surrounding the asset. In the railroad industry, for example, assets may be railroad tracks, as well as cars that travel along the tracks (and their constituent parts). In the airline industry, the assets may include airplanes and corresponding parts that are inspected, as well as runway conditions. The data sources 104 may include detectors, such as probes, sensors, and other instrumentation that are configured to measure qualitative aspects of the assets or surrounding conditions, such as temperature, weight or load, strain, dimensions (e.g., indications of wear), sound, and images, to name a few. In the railroad industry, the measurements may be taken with regard to railroad track components and vehicle wheels. In this embodiment, detectors that may be used as sources of data include machine vision detectors (MVDs), wheel impact load detectors (WILDS), optical geometry detectors (OCDs), truck performance detectors (TPDs), acoustic bay detectors (ABDs), hot box detectors, warm bearing detectors, and hot wheel/cold wheel detectors. In addition to the qualitative aspects, the data sources 104 may capture time, physical location, object location, and other information regarding the subject of measurement, as will be described herein. In this regard, the data sources 104 reflect multi-dimensional detection devices, as they are configured to collect a wide variety of different types of information.

The data sources 104A-104n may include (or may be coupled to) corresponding communication components 116A-116n (referred to collectively as communication components 116) for transmitting captured data over one or more networks. In an embodiment, the communication components 116 may include, e.g., transceivers, antennae, and/or network cards for receiving and conveying data using wireless and/or wireline transmission technologies including radio frequency (RF), WiFi, Bluetooth, cellular, satellite, copper wiring, co-axial cabling, etc. For example, a probe on one of the data sources 104 collects data from a location (e.g., a location on a railroad track) and transfers the data to the corresponding communication component 116 for transmission over networks 110 to the host system 102. In an embodiment, as shown in FIG. 1, the networks 110 may include one or more reader devices 108 for receiving the data from the data sources 104. In the railroad industry, e.g., the reader devices 108 may be RF readers positioned at defined locations (e.g., at fixed-length intervals) along the railroad track. The RF readers 108 read data from corresponding data sources 104 (via the communication components 116, which may be RF antennae) as the data sources 104 (embedded in the vehicles) pass within communicative range of the reader devices 108.

In an embodiment, the data captured by the data sources 104 may be transmitted as raw data to the host system 102 or may be processed prior to transmission. The data sources 104A-104n may also include corresponding computer processors 118A-118n (collectively referred to as computer processors 118) for processing the raw data and/or formatting the data for transmission over the networks 110. Alternatively, if the data sources 104 do not include a computer processor, the captured data may be transmitted via the communication components 116 to a computer processor configured for receiving the data.

In another embodiment, some of the data sources 104 may alternatively include other information sources, such as cameras or portable communication devices (e.g., cellular telephones, smart phones, or other portable devices) operated by users who are in direct observation of the asset or surrounding conditions who have observed an event that may have an impact on safety. The data collected by the host system 102 from these portable devices may include texts, images, messages, or other information provided by a user of a communication device. For example, an observer near a railroad track may witness a previously unreported defect or anomaly, record an image of the defect, and transmit the image with date/time information, and alternatively a text description, to the host system 102 or another entity which forwards the information to the host system 102.

The networks 110 may include any type of networks, such as local area networks, wide area networks, virtual private networks, and the Internet. In addition, the networks 110 may be configured to support wireless communications, e.g., via radio frequency (RF) communications, cellular networks, satellite networks, and global positioning (GPS) systems.

The host system 102 executes logic 112 for implementing the exemplary predictive modeling, as well as other processes, as described herein. The logic 112 includes a user interface component for enabling authorized users to set preferences used in configuring data sources 104 employed in the processes described herein, as well as generating and executing predictive models, performing analysis on the histories of previously implemented models, and facilitating the generation of new models, or evolvement of existing models, to increase the ability for the managing entity to ensure reliable operation. The preferences may include designating a frequency of data collection by the data sources 104. The logic 112 may also be configured to utilize the information acquired from execution of the models to analyze and adopt maintenance and repair plans for components of the asset. These, and other features of the predictive modeling, will be described further herein.

The host system 102 is communicatively coupled to a storage device 114 that stores various data used in implementing the predictive modeling. For example, the storage device 114 may store models, performance histories (e.g., alarm histories, repair histories, etc.), and other information desired. The storage device 114 may be directly in communication with the host system 102 (e.g., via cabling) or may be logically addressable by the host system 102, e.g., as a consolidated data source over one or more networks 110.

Predictive models are generated from history data collected from the data sources 104. Patterns of data from the measurements and resulting repair work or maintenance schedules can be used in a predictive manner for estimating when maintenance should be performed. In addition, as new data is received, the predictive models can be updated to reflect any changes discovered. A user interface of the logic 112 may be used to present organized history data, as well as alert information. The created model may be stored as one of several stored models, e.g., in the storage device 114 of FIG. 1. As new data is received from the data sources 104, it can be applied to the predictive models and may be used to update the models in order to ascertain future maintenance needs or critical issues that require immediate attention.

Figure 2:
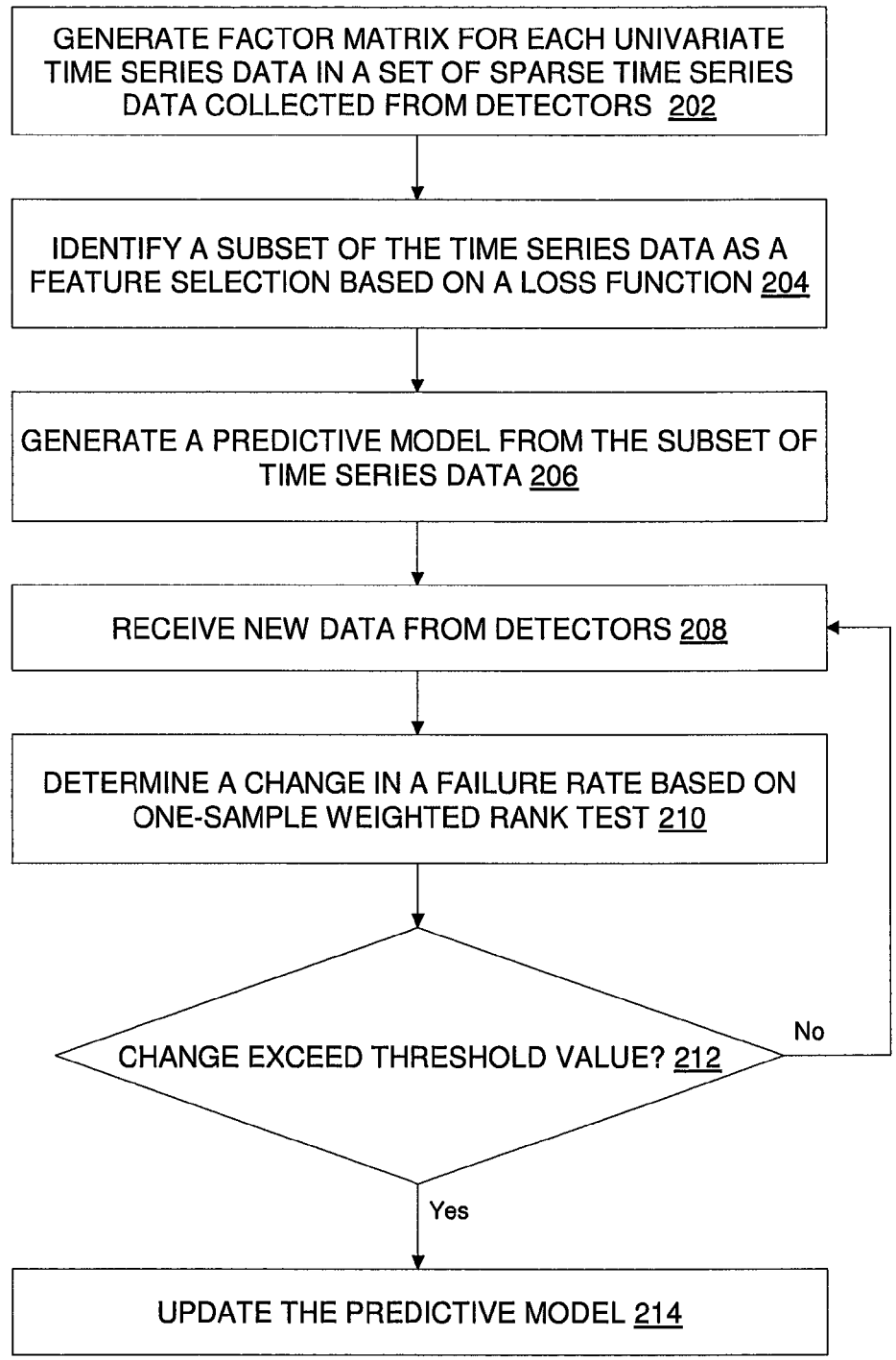
FIG. 2 depicts a flow diagram describing a process for implementing predictive modeling for asset management according to an embodiment of the present invention.

Turning now to FIG. 2, a flow diagram describing a process for implementing the predictive modeling will now be described in an exemplary embodiment. In one embodiment, the services may provide a web-based user interface for receiving information from a user in creating and implementing a model. Once accessed, the user interface, via the logic 112, prompts a user through the process. The process assumes that history data has been collected over a period of time. The history data may include detector data, alarm information, and maintenance data. It will be understood that the data collected may be sparse time series data. For example, in the railroad industry, the detectors may not be evenly distributed across the network, thus the number of readings may vary dramatically across different locations in the railroad system. Also, for some types of detectors, the time series of readings may be sparse due to, e.g., infrequent use of the asset in which the detector readings are taken, as compared to other assets. The predictive modeling is configured to handle the sparsity in the detector data.

At step 202, the logic 112 generates a factor matrix for each univariate time series data in a set of sparse time series data collected from a group of detectors over time. In an embodiment, this may be implemented using supervised matrix factorization (SMF) techniques. In this example, let X denote the multi-dimensional time series from different types of detectors. These detectors generate p univariate time series (e.g., p influential factors) denoted as $X=(X_1, X_2, \ldots, X_p)$. Some time series could be sparse (e.g., they may be sparse as a result of being sparsely sampled over time, or they may represent incomplete or noisy data). Let Y be the label vector for the asset failures (e.g., 1 indicates a failure, and 0 indicates good condition). The SMF for the ith, i=1, 2, . . . p, univariate time series may be represented as:

$$X_i \approx H_i V_i^T$$

$$Y \approx logit(H_i W_i^T)$$

$$(H_i^*, V_i^*, W_i^*) =$$

$$\operatorname*{argmin}_{H_i, V_i, W_i} \mu L_R(X_i, H_i V_i^T) + (1-\mu) L_{CA}(Y, logit(H_i W_i^T)) + Reg(H_i, V_i, W_i)$$

$H_i$ is the latent representation of time series, where each row defines the latent features of the original time series in $X_i$. Similarly, $V_i$ is the latent representation of time points. SMF is used to find optimal latent representation matrices in order to best approximate the matrices X and Y via a loss function optimization technique. The latent representation matrix H is a good estimate of observed time series, and useful features may be extracted from H, such as trend and diversification.

'T' is the transpose of a matrix;

W is a set of linear logistic regression weights;

logit is the cell-wise logistic function;

$L_R$ is the reconstruction loss, which makes sure that the latent feature matrices H and V could reconstruct X;

$L_{CA}$ is the supervised classification accuracy loss term, which enforces the latent time series representation H to be corrected such that a set of all-versus-one logistic regression weights W can maximize the classification accuracy on the data set;

Reg is the regularization term, which ensures that the latent matrices do not overfit; and μ is the weight of $L_R$ and $\mu \in (0,1)$.

At step 204, a subset of the time series data is identified as a feature selection, which is determined based on a loss function. For each predictor X (where $X_i$ is the ith predictor), calculate the minimum loss, then rank the predictors in the order of the optimized loss. The predictor importance indicates the relative importance of each predictor in predicting the bad trucks (i.e., the best predictors to approximate the label vector Y in terms of the loss).

At step 206, the logic 112 generates a predictive model from the subset of time series data. The predictive model is configured to predict a failure using, e.g., data mining, machine learning, and/or statistical modeling. Different predictive models may be generated for asset failures. For example, in the railroad industry, data from multiple detectors (e.g., WILD, MV, and OGD) may be used in the analysis. Suppose a decision tree method is used to predict the occurrence of truck failures in three months with sparse time series data, and the prediction accuracy of the model is high for both training and testing data. The model may ben correctly classify most bad truck records as failed in both the training and test datasets. Other predictive methods can be used as well, such as neural network, Support Vector Machine (SVM), and statistical models (e.g., Cox Proportional Hazards model or Andersen-Gill model). The predictive model may then be used to render decisions regarding inspection and repair of the asset.

At step 208, the logic 112 receives new data from the detectors and compares the model predictions to actual data that is newly received. The new data may be real-time or near real-time data streamed from one or more of the data sources 104 to the host system 102 over the networks 110. As shown, for example, in FIG. 3, a failure rate chart 300 for an asset is generated based on the one-sample weighted rank test.

A non-parametric one-sample weighted rank test may be represented as:

$$H_0: h_0(t) = h(t), \text{ for } t \leq \tau$$

$$H_1: h_0(t) < h(t), \text{ for } t \leq \tau$$

$$Z(\tau) = \frac{\sum_{i=1}^{D_I} W(t_i) \frac{d_i}{Y(t_i)} - \int_0^\tau W(s) h_0(s) ds}{\sqrt{\int_0^\tau W^2(s) \frac{h_0(s)}{Y(s)} ds}}$$

An operational characteristics function is expressed as:

$$n = (Z_\alpha + Z_\beta)^2 \cdot \frac{\int_0^\tau w^2(s) h_0(s)/y(s)\,ds}{\{\int_0^\tau w(s)[h(s) - h_0(s)]\,ds\}^2}$$

The statistic follows the standard normal distribution for large samples under $H_0$. $\tau$ is selected as the largest failure time in the monitoring subgroup.

At step 210, the logic 112 determines a change in a failure rate based on a one-sample weighted rank test. At step 212, it is determined if the change exceeds a threshold value (referred to herein as 'upper control limit'). The threshold value may be defined by an authorized user of the logic 112. If the change does not exceed the threshold value, the process returns to step 208.

Figure 3:
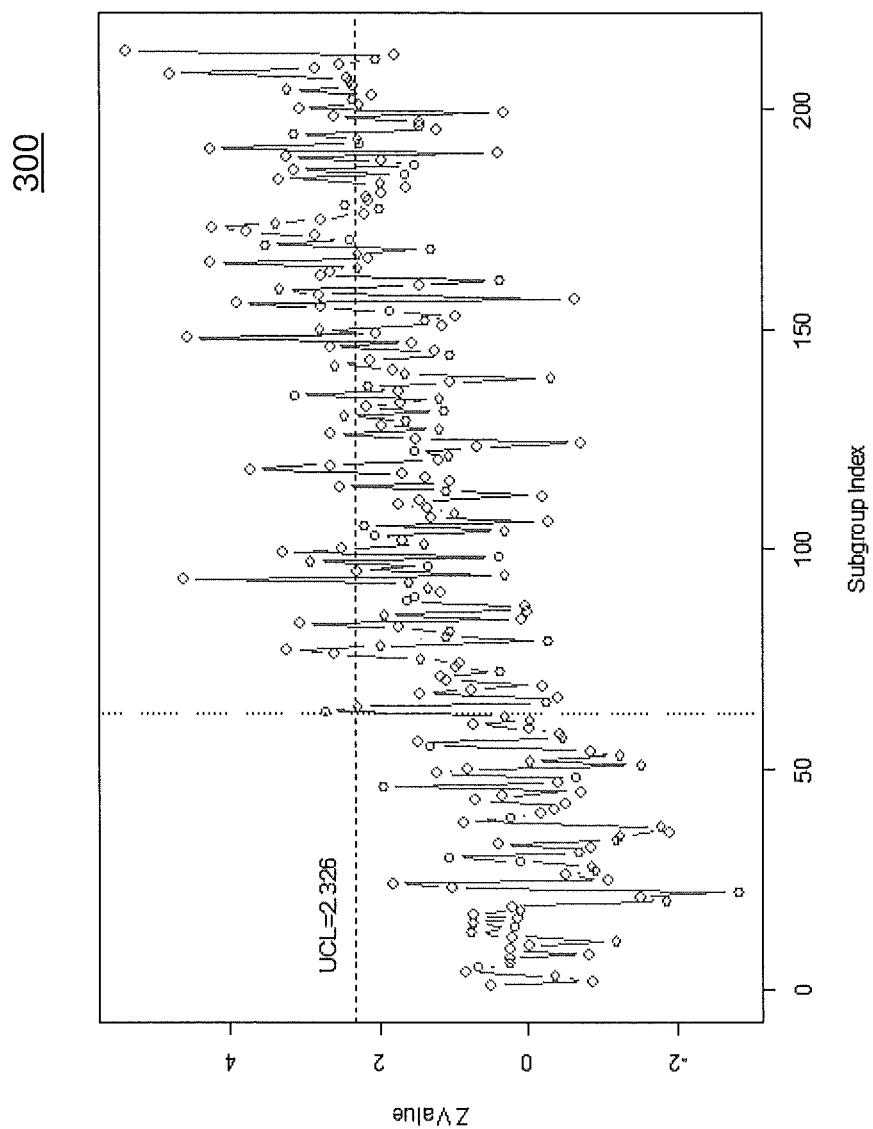
FIG. 3 depicts a failure rate control chart with sample data for identifying changes in failure rate of an asset according to an embodiment of the present invention.

If, however, the change exceeds the threshold value, the logic 112 updates the predictive model to reflect the change at step 214. As shown in FIG. 3, the failure rate of the asset became worse over time since the Z value is gradually increasing, and at the subgroup 63, it exceeds the upper control limit (UCL=2.326) for the first time. Subgroup refers to a term used in control charts for Statistical Process Control (SPC). The subgroup is a sample with a fixed sample size (i.e., the number of observations is fixed). In this embodiment, the subgroup represents a sample containing a fixed number of failures.

The model can be updated by using, e.g., the Bayesian inference method as shown below (where $\Phi$ denotes the predictive model parameters which need to be updated):

$$p(\Phi|D,M) \propto p(D|M,\Phi) p(\Phi|M)$$

D represents the data, and M represents the model.

$p(\Phi|D, M)$ represents the updated joint probability density function.

In addition, $p(D|M, \Phi)$ represents the data likelihood function based on the performance model, and the function $p(\Phi|M)$ represents the prior probability density function selected for the model.

As indicated above, the predictive modeling process of FIG. 2 assumes that history data has been collected over a period of time and may include, e.g., detector data, alarm information, and maintenance data. In addition, the data collected may be sparse time series data. An online learning system may be employed using information fusion techniques to integrate the history data that is received from multiple types of disparate detection devices. The online learning system and process is configured to integrate information collected from spatially- and temporally-incompatible detection devices to enable predictive maintenance for asset management. The online learning system and process utilizes historical detector data along with failure data to determine patterns of detector readings that may be subcritical, thereby leading to failures across multiple detectors with sparse sampling. The fusion techniques provide the ability to study assets that move across the detector network and enable information from these assets to be integrated across time and space. By fusing this information collected from multiple detectors, an integrated insight into equipment conditions can be gleaned. In addition, the on line learning system and process combines offline and online learning engines to generate failure alerts for equipment predictive maintenance.

The online learning system and process is described herein with respect to the railroad industry. However, it will be understood that the online learning system may be adapted for other industries as well. Thus, the embodiments described herein are for illustrative purposes and are not intended to limit the scope of thereof.

Figure 4:
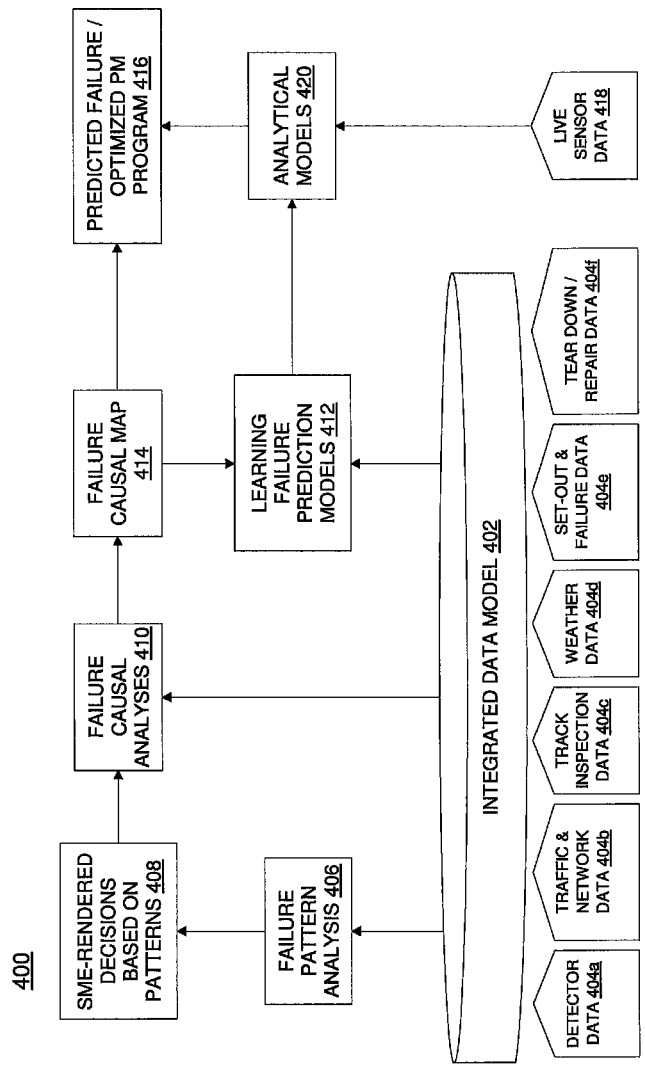
FIG. 4 depicts components and functions for online learning and information fusion according to an embodiment of the present invention.

Turning now to FIG. 4, a system 400, and functional components thereof, through which the online learning and fusion processes may be implemented will now be described in an embodiment.

The system 400 includes an integrated data model 402 that is generated from a variety of data 404 collected offline. As shown in FIG. 4, the data 404 includes wayside detector data 404a, traffic and network data 404b, track inspection data 404c, weather data 404d, set-out and failure data 404e, and tear down/repair data 404f. It will be understood that additional (or fewer) data elements may be employed to realize the advantages of the embodiments described herein. The data 404 may be collected by the data sources 104 of FIG. 1 and transmitted to the host system 102 for processing by the logic 112. The logic 112 generates the integrated data model 402 as described herein.

Figure 5:
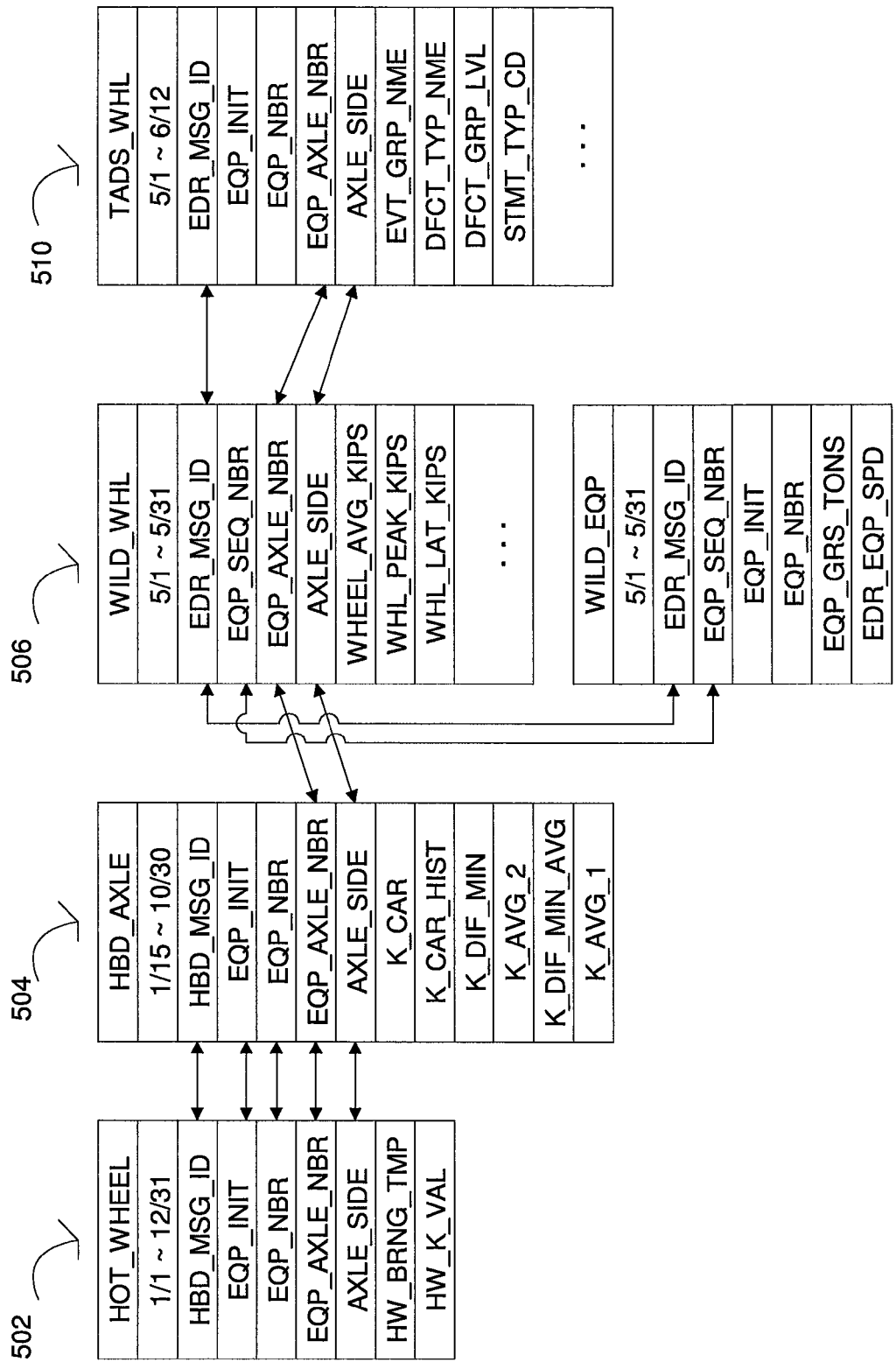
FIG. 5 depicts records of data that may be merged by information fusion techniques according to an embodiment of the present invention.

The integrated data model 402 is generated in part by merging disparate data from multi-dimensional detection devices (e.g., data sources 104 of FIG. 1). The data sources 104 collect information, which data is stored as history data in one or more storage locations (e.g., storage device 114). The data may be stored in various tables. FIG. 5 illustrates tables of sample data to be merged in a railroad industry environment. A first table 502 provides data regarding a vehicle wheel (HOT_WHEEL) collected from January $1^{st}$ through December $31^{st}$ of a given year. The detector used in the collection may be a hot wheel detector (HWD) that is attached to a railroad track at a specified, fixed location, and includes a temperature sensor to measure temperature of the wheel as it passes the location on the track. The information stored in the table 502 may include message identification information, equipment identification information, and temperature measured, to name a few.

A second table 504 provides data regarding a vehicle axle (HBD_AXLE) collected from January $15^{th}$ through October $30^{th}$ of the same given year. The detector used in the collection may be a hot box detector (HBD) for an axle that is attached to a railroad track at a specified, fixed location, and includes a temperature sensor to measure temperature of the axle as it passes the location on the track.

A third table 506 provides data regarding impact load for a wheel (WILD_WHL) collected from January $1^{st}$ through December $31^{st}$ of two years covering the same given year. The detector used in the collection may be a wheel impact load detector (WILD) that is attached to a railroad track at a specified, fixed location, and includes a sensor that determines an amount of load or force on the track (e.g., measured in KIPS).

A fourth table 507 provides data regarding equipment or railcar that was collected from the same two years as the table above. The detector used in the collection may be a wheel impact load detector (WILD) that is attached to a railroad track at a specified, fixed location, and includes a sensor that determines the measurements at equipment level, such as equipment speed.

A fifth table 510 provides data regarding a noise signature emitted by bearings collected from the same two years. The detector used in the collection may be an acoustic bearing detector (ABD) that is attached to a railroad track at a specified, fixed location, and includes a sensor that captures any anomalies in the noise signature emitted by bearing in motion and the detector processes this information internally and issues alarms when an anomalous acoustic signature is detected.

As indicated above, the detectors associated with these tables acquire very different information (e.g., temperature readings and load bearing information). The logic 112 is configured to merge the data in these tables where shared fields are known. For example, the data in table 502 can be merged with data in table 504 through common fields HBD_MSG_ID, EQP_INIT, EQP_NBR, EQP_ACLE_NBR, and AXLE_SIDE, which occur in both tables. Likewise, tables 502 and 504 may be merged with table 506 through common fields EQP_AXLE_NBR and AXLE_SIDE. In addition, table 506 can be merged with table 507 through common fields EDR_MSG_ID and EQP_SEQ_NBR, as well as with table 510 through common fields EDR_MSG_ID, EQP_AXLE_NBR, and AXLE_SIDE. By way of example, using the vehicle identifier, monthly data regarding each vehicle can be aggregated for each detector.

The logic 112 utilizes the integrated data model 402 to perform failure pattern analysis 406 and failure causal analysis 410. Insights from the perspectives of preventative maintenance, procurement decision, and railway operations can be obtained by discovering correlations in the historical data that associates failures with equipment physical parameters (e.g., weight, flange thickness, flange height, rim thickness, etc.), equipment operation parameters (e.g., speed, dynamic load, bearing temperature, etc.), and external parameters (e.g., weather, usage history). Traffic & network data 404b includes data that measures the traffic volumes or number of railcars passing through the rail segments. Track inspection data 404c provides inspection records which may indicate the condition of the tracks. Weather data 404d includes any weather-related information that may have an impact on railway operating conditions (e.g., those that might result in derailment). The set-out & failure data 404e and the tear down/repair data 404f provide maintenance records including equipment failures and repair information.

Failure pattern analysis 406, subject matter expert (SME)-rendered decisions 408, failure causal analyses 410, learning failure prediction models 412, and failure causal map 414 are associated with an offline learning engine based on the large volume of data collected for these elements. The failure pattern analysis component 406 of the offline learning engine is an analytics engine configured to discover failure patterns such as seasonality patterns of failures. The failure causal analyses component 410 of the offline learning engine identifies the factors that drive the patterns while leveraging SME knowledge in 408. The failure causal map 414 provides a tool to visualize the causal factors and failure patterns. The learning failure prediction models 412 develop the failure prediction engine based on the failure patterns and causal factors. Once the offline learning engine is developed, it is used in an online fashion with real-time data (e.g., live sensor data 418). When the detector data 418 is received, it is fed to the analytical models 420. Prediction outputs and decision recommendations resulting from the models 420 is displayed in a predicted failure/optimized preventative maintenance program 416.

In order to reduce immediate service interruptions and to provide better prediction of asset failures, one goal is to maximize the occurrences of crew set-outs and reduce the inspection and maintenance costs. With reference to the railroad industry, e.g., components of analytics involved in this goal relate to alarm prediction, bad truck prediction, and bad wheel prediction (as described above with respect to FIGS. 1-3). In alarm prediction, multiple detectors (HBD, ABD, and WILD) can aid in predicting the most severe alarm related to hot bearings within a meaningful advanced amount of time (e.g., 7 days in advance of actual alarm/incident occurrence to reduce the immediate train stops). In bad truck prediction analysis, wheels and trucks are replaced when they create high impact or wear out. To identify patterns in wheel movement error, wheel dimension and wheel impact load data may be used to detect truck performance issues earlier using multiple detectors, such as MV, OGD, TPD, and WILD. To identify patterns in wheel dimensions, movement errors and wheel impact load that predict the wheel defects earlier may be determined from data received from multiple detectors, such as MV, OGD, and WILD.

Railroads issue Level 1 (L1) alarms when the detector readings reach the most severe category and thus immediate train stoppage is generally required. Predicting an L1 alarm in advance is desirable so that operators have sufficient time to respond. One goal in developing an alarm prediction model is to keep false alarm rates low due to constraints in corresponding resources. Another goal is to provide human interpretable rules to facilitate decision processes by operators.

In an embodiment, alarm prediction processes are provided. The alarm prediction processes are configured to accomplish the above-referenced goals. Alarm prediction may be summarized as a classification problem where one class relates to detector readings history with alarms, and the other class relates to detector readings history without alarms. The exemplary alarm prediction processes utilize Support Vector Machine (SVM) techniques. In the alarm prediction, two sets of parameters are provided and may be customized. One set is the prediction time window (i.e., how many days in advance the alarm prediction is generated). Based on the trade-offs between operational constraints versus accuracy of prediction, the process offers predictions for 3 or 7 days in advance, which in turn may provide enough buffering time to prepare for inspections based on operation conditions. The second set of parameters is the historical detector reading time window that indicates how many days of past detector readings may be used to provide a forecast. Based on the trade-offs between availability of historic data in detector data storage systems versus the accuracy of prediction, the process may include two options. For purposes of illustration the options are 7 days and 14 days. By combining the two sets of parameters, there are now four settings, i.e., 7-7, 7-3, 14-7, and 14-3. The first number of each setting indicates the reading time window, and the second number in each setting reflects the prediction time window. For example, 7-3 means using the past 7 days of readings, an alarm prediction of 3 days in the future can be provided.

Figure 6:
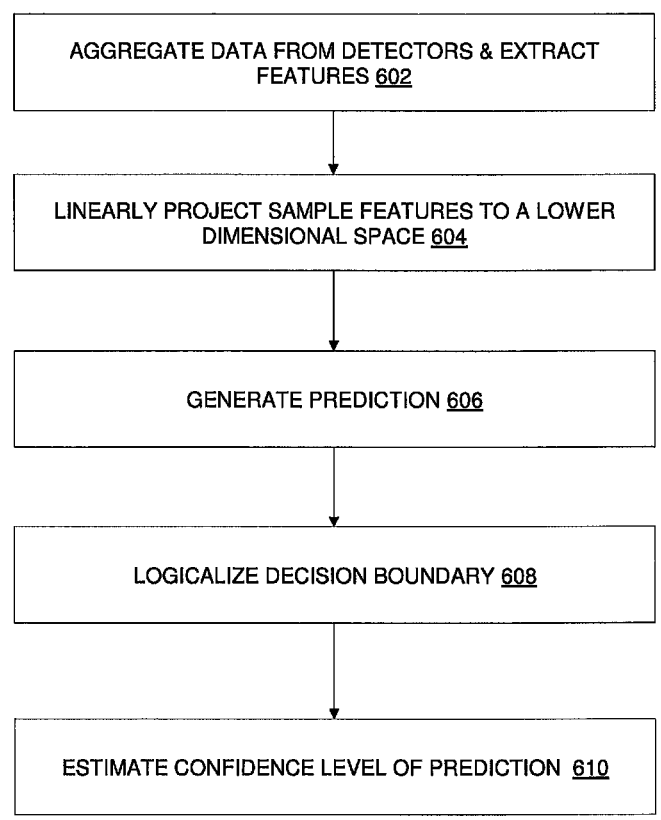
FIG. 6 depicts a flow diagram of a process for implementing alarm prediction processes according to an embodiment of the present invention.

Turning now to FIG. 6, the alarm prediction processes will now be described in an embodiment. At step 602, data is aggregated from detectors (e.g., the data sources 104 of FIG. 1 including the data elements 404 in FIG. 4), and features are extracted (e.g., using quantiles) for each numeric value variable. The features may each be a vector of equal length. In the feature extraction, historical multi-detector readings, e.g., ABD, HBD, and WILD, as well as extract features are combined and aggregated using quantiles for each numeric value variable. At step 604, sample features are linearly projected to a lower dimensional space (e.g., a learned non-linear decision boundary) while maintaining a comparable learning performance, which in turn may reduce both the time and memory complexities required by the learning model.

Figure 7B:
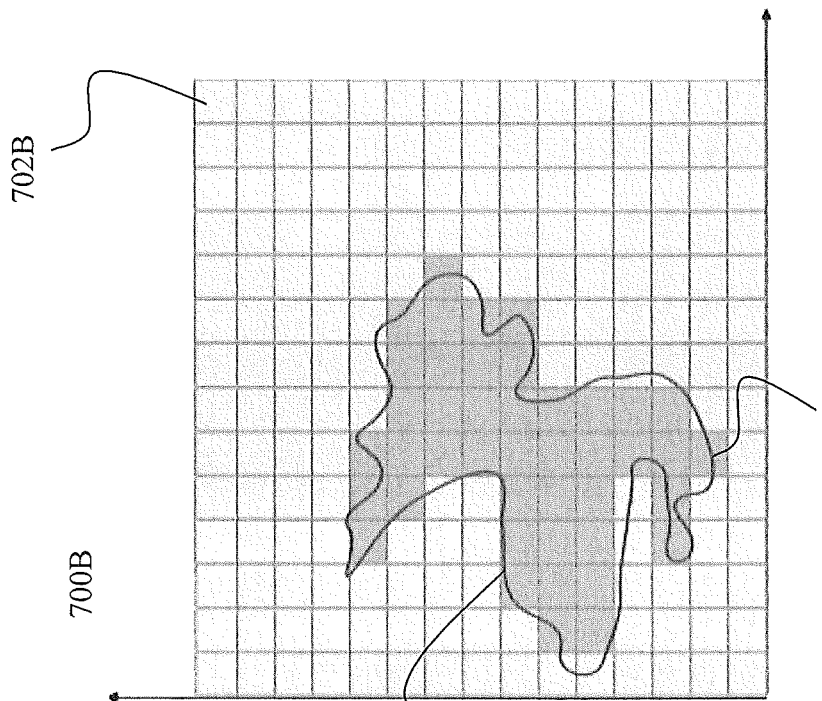
FIGS. 7A and 7B each depicts a two-dimensional chart of sampled data according to an embodiment of the present invention.
Figure 7A:
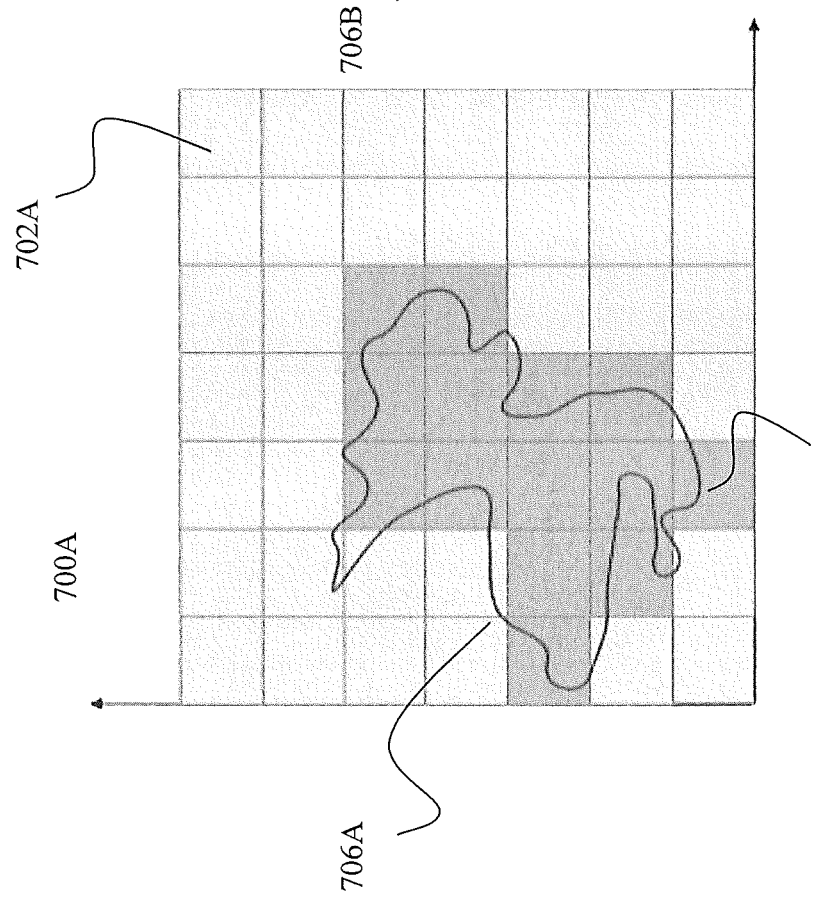

At step 606, a prediction is generated based on its location in the feature space to the support vectors (e.g., the key samples that lie in the border area between positives and negatives). In step 608, a decision boundary is logicalized. Human interpretable rules are extracted given the complex SVM classification results. As shown in FIG. 7A for example, a grid 700A illustrates feature space in which all blocks constitute the feasible feature space, and each block is a sample. Based on learning decisions, positive samples are darkened (704a). A curve 706a represents a separating or decision boundary. The feature space of the grid 700A illustrates a coarse logical rule search. Using the same two-dimensional learning problem, a grid 700B in FIG. 7B illustrates a feature space comprising smaller (finer grid search) blocks 702b. In comparison to the grid 700A, the decision boundary 706b is more precise. The rule logicalization is, thus, scalable to a desired granular level.

From execution of the rules, the logic 112 may calculate the probability or risk. For example, the logic 112 may predict whether a bearing will issue a L1 alarm within a defined future time period based on its location (in feature space) to the support vectors (i.e., the key samples that lie in the border area between positives and negatives). In addition to predicting whether an alarm will be issued or not, the corresponding confidence is estimated based on the relative position to the support vectors at step 610.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A system, comprising:
    a plurality of data sources configured to capture data related to components of an asset that is deployed at an operation site, the data sources comprising instrumentation that physically reside at the operation site and measure qualitative aspects of the components during operation of the asset and ambient conditions surrounding the asset at the operation site;
    a computer processing device communicatively coupled to the plurality of data sources over a network; and
    logic executable by the computer processing device, the logic configured to implement:
    receiving the data from the plurality of data sources over the network;
    storing the data in tables each corresponding to a respective component and one of a plurality of subjects of measurement, wherein a type of the instrumentation used is a function of the subject of measurement;
    identifying common fields shared across the tables of each respective component; and
    merging at least a portion of the data across the tables having the common fields into a final table for each respective component to produce
    an integrated data model based on results of the merging.

2. The system of claim 1, wherein the tables include a first table and a second table, the first table storing information about a first subject of the plurality of subjects of measurement, the information collected over a first period of time, and the second table storing information about a second subject of the plurality of subjects of measurement that is different than the first subject of measurement, the information about the second subject of measurement collected over a second period of time that partially overlaps with the first period of time;
    wherein the merging includes merging only the data that shares an overlapping period of time between the first period of time and the second period of time.

3. The system of claim 1, wherein the tables include a first table and a second table, the first table storing information about a first subject of the plurality of subjects of measurement, the information collected by a first detection device of the plurality of data sources, and the second table storing information about a second subject of the plurality of subjects of measurement that is different than the first subject of measurement, the information about the second subject of measurement including a measurement of a physical parameter that is common to the first subject of measurement and the second subject of measurement;
    wherein the merging includes merging data that share the physical parameter that is common to the first subject of measurement and the second subject of measurement.

4. The system of claim 1, further comprising logic configured to implement:
    applying the model to new data received from the plurality of data sources and performing failure pattern analysis and failure causal analysis on the new data.

5. The system of claim 1, wherein the plurality of data sources physically reside in a railroad environment and physical parameters associated with train wheels and tracks as the components include at least one of:
    weight;
    flange thickness;
    flange height; and
    rim thickness.

6. The system of claim 1, wherein the plurality of data sources physically reside in a railroad environment and operational parameters associated with the subject of measurement include at least one of:
    speed;
    dynamic load; and
    bearing temperature.

7. The system of claim 1, wherein the plurality of data sources physically reside in a railroad environment and external factors associated with the subject of measurement include at least one of:
    weather; and
    usage history.

* * * * *